(12) United States Patent
Rennig et al.

(10) Patent No.: US 9,584,065 B2
(45) Date of Patent: Feb. 28, 2017

(54) SOLAR CELL STRUCTURE

(71) Applicant: BASF SE, Ludwigshafen (DE)

(72) Inventors: Alfred Rennig, Boechingen (DE); Markus Hammermann, Dossenheim (DE); Felix Eickemeyer, Mannheim (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/611,380

(22) Filed: Feb. 2, 2015

(65) Prior Publication Data

US 2015/0144192 A1 May 28, 2015

Related U.S. Application Data

(62) Division of application No. 12/673,905, filed as application No. PCT/EP2008/060619 on Aug. 13, 2008, now abandoned.

(30) Foreign Application Priority Data

Aug. 17, 2007 (EP) .................... 07114526

(51) Int. Cl.
*H01L 31/055* (2014.01)
*H02S 40/20* (2014.01)
(Continued)

(52) U.S. Cl.
CPC ............. *H02S 40/20* (2014.12); *H01G 9/209* (2013.01); *H01G 9/2059* (2013.01);
(Continued)

(58) Field of Classification Search
CPC ..... H01L 31/00; H01L 31/02; H01L 31/0203; H01L 31/0216; H01L 31/02168;
(Continued)

(56) References Cited

U.S. PATENT DOCUMENTS 4,130,445 A 12/1978 Blieden
4,190,465 A * 2/1980 Boling .................. H01L 31/055
136/247

(Continued)

FOREIGN PATENT DOCUMENTS

JP 2001-185242 7/2001
JP 2001-352091 12/2001
(Continued)

OTHER PUBLICATIONS

Sarti, D. et al., "Transformation Du Rayonnement Solaire Par Fluorescence: Application A L'Encapsulation Des Cellules", Solar Cells, vol. 4, Seiten 25-35, XP-002562879, (1981).

(Continued)

*Primary Examiner* — Christina Chern
(74) *Attorney, Agent, or Firm* — Oblon, McClelland, Maier & Neustadt, L.L.P.

(57) ABSTRACT

The invention relates to a solar cell structure (10) having at least one transparent photovoltaic cell (42), in particular having a dye solar cell or a thin-film semiconductor cell. It comprises at least one polymer layer (36) which is provided with a fluorescent material, or a mixture of a plurality of fluorescent materials, and covers the at least one transparent photovoltaic cell (42).

19 Claims, 2 Drawing Sheets

(51) Int. Cl.
*H01L 31/048* (2014.01)
*H01L 51/44* (2006.01)
*H01L 31/054* (2014.01)
*H01G 9/20* (2006.01)

(52) U.S. Cl.
CPC ......... *H01G 9/2068* (2013.01); *H01L 31/048* (2013.01); *H01L 31/055* (2013.01); *H01L 31/0547* (2014.12); *H01L 51/447* (2013.01); *H01G 9/2031* (2013.01); *Y02E 10/52* (2013.01); *Y02E 10/542* (2013.01); *Y02E 10/549* (2013.01)

(58) Field of Classification Search
CPC ........... H01L 31/02167; H01L 31/0232; H01L 31/02322; H01L 31/02327; H01L 31/0248; H01L 31/04; H01L 31/0445; H01L 31/048; H01L 31/049; H01L 31/02325; H01L 31/055; H01L 31/054; H01L 31/056; H01L 31/0547
See application file for complete search history.

(56) References Cited

U.S. PATENT DOCUMENTS

| | | | | |
|---|---|---|---|---|
| 4,753,683 | A * | 6/1988 | Ellion | H01L 31/048 136/244 |
| 2002/0134424 | A1 * | 9/2002 | Vaz | H01L 31/055 136/247 |
| 2003/0056820 | A1 | 3/2003 | MacDonald | |
| 2005/0081910 | A1 * | 4/2005 | Danielson | H01L 31/0687 136/255 |
| 2006/0130894 | A1 * | 6/2006 | Gui | F21S 9/037 136/263 |
| 2007/0025139 | A1 | 2/2007 | Parsons | |
| 2007/0137696 | A1 | 6/2007 | Krokoszinski et al. | |
| 2007/0272297 | A1 * | 11/2007 | Krivoshlykov | H01L 31/0352 136/256 |
| 2008/0245411 | A1 | 10/2008 | Hammermann et al. | |
| 2009/0095341 | A1 * | 4/2009 | Pfenninger | H01L 31/048 136/246 |
| 2009/0229652 | A1 * | 9/2009 | Mapel | H01L 31/055 136/246 |

FOREIGN PATENT DOCUMENTS

| | | | |
|---|---|---|---|
| JP | 2004-111742 | 4/2004 | |
| JP | 2006-210229 | 8/2006 | |
| JP | 2007-27271 | 2/2007 | |
| KR | 10-2007-0020056 A | 2/2007 | |
| WO | WO 2005/113678 A1 | 12/2005 | |
| WO | WO 2006/088369 | * 8/2006 | ........... H01L 31/055 |

OTHER PUBLICATIONS

Weber, W.H. et al., "Luminescent greenhouse collector for solar radiation", Applied Optics, vol. 15, No. 10, pp. 2299-2300, (1976).
Goetzberger, A. et al., "Solar Energy Conversion with Fluorescent Collectors", Applied Physics, vol. 14, pp. 123-139, (1977).
"Planar solar energy convertor and concentrator based on uranyl-doped glass", Nature, vol. 274, pp. 144-145, (Jul. 13, 1978).
Definition of layer from Mirriam-Webster retrieved Sep. 23, 2014.
Maruyama, Toshiro et al., "Transdormations of the wavelength of the light incident upon CdS/CdTe solar cells", Solar Energy Materials and Solar Cells, vol. 69, No. 1, pp. 61-68, (2001).
Nozik, A.J., "Quantum Dot Solar Cells", Electrochemical Society Proceedings, vol. 10, pp. 61-68, (2001).
Transparent Solar Cells MIT Energy Initiative at http://energy.mit.edu/news/transparent-solar-cells/ accessed Aug. 19, 2016.

* cited by examiner

SOLAR CELL STRUCTURE

This application is a Divisional of U.S. application Ser. No. 12/673,905, filed Feb. 17, 2010, which is the National Stage of International Application No. PCT/EP08/60619, filed Aug. 13, 2008, which claimed priority to European patent application no. 07114526.2, filed Aug. 17, 2007, of which all of the disclosures are incorporated herein by reference in their entireties.

TECHNICAL FIELD

The present invention relates to a solar cell structure which comprises one or more polymer layers doped with a fluorescent dye or a mixture of a plurality of fluorescent dyes, on or between which there are one or more transparent solar cells, transparent solar cells being distinguished in that the photoactive layer has an absorption of less than 80% at the absorption maximum.

PRIOR ART

The use of fluorescent solar collectors for converting the sun's spectrum into a spectrum that is better adapted to the spectral sensitivity of solar cells was already described in the 1970s, cf. U.S. Pat. No. 4,110,123 and Weber et al., Applied Physics, 15, 1976, 2299-2300.

On the one hand, the energy of the sunlight can be utilized better by solar cells which have an improved spectral sensitivity. In conventional solar cells, for example solar cells made from silicon, a large part of the energy is lost in the form of heat. The band gap of crystalline silicon is 1.1 eV. All the sunlight photons with a high energy can be absorbed by the solar cell, but conversion of the excess energy into heat takes place. The heating of the solar cell in turn reduces its efficiency. Luminescent molecules transport the absorbed spectrum of the sun at low energies, so that the heating of the solar cell can be reduced by a suitable selection of the molecules. Instead of the solar cell being heated, the matrix in which the luminescent molecules are embedded becomes heated.

On the other hand, through the use of luminescent solar collectors it is possible to reduce the required area which needs to be equipped with solar cells, by the light being conducted to the borders by total reflection in a matrix which, for example, is made from glass or plastic. The individual solar cells are located at the borders. With this embodiment, the costs of the overall structure can be reduced significantly compared with a flatly installed solar cell.

A plurality of possible arrangements of solar cells and fluorescent collectors are described in the publication by Götzberger & Greubel, Applied Physics, 14, (1977) 123-139. A theoretically possible conversion efficiency of 32% under optimal conditions is indicated, which is considerably higher than the conversion efficiency of solar cells currently available.

U.S. Pat. No. 4,367,367 Reisfeld et al. and the publication Nature 274 (1978), pages 144-145, disclose the use of uranyl-additivated glasses and combinations with fluorescent dyes for use as solar collectors. A dye in this case respectively absorbs a particular wavelength region of the sunlight and emits it in another wavelength region, in which a specific solar cell has its respective highest sensitivity. The solar spectrum of the sun can be utilized optimally by a suitable structure comprising a plurality of layers of dyes and different solar cells.

None of the solar collectors described so far, comprising luminescent or fluorescent systems, has yet experienced commercial use, let alone development to the level of mass production, since on the one hand the organic dyes used suffer from degradation in sunlight, and on the other hand inorganic phosphorescent emitters do not have sufficient quantum efficiencies in order to overcome the absorption losses in the solar collector.

In recent years, however, development of new more stable fluorescent dyes has taken place, which could be used in solar collectors. The publication Maruyama & Kitamura, Solar Energy Materials and Solar Cells 69(1), (2001), pages 61-68, reveals the way in which a fluorescent dye, which is applied flatly onto a CDS/CDTE solar cell in a solar collector, might make it possible to increase the power of the solar cell by up to 14%. The publication Nozik et al., Electrochemicals Soc. Proc. Vol., Volume 10 (2001), pages 61-68, discloses the use of a combination of quantum dots with solar cells. The quantum dots used have a high stability and are not subject to photodegradation. On the other hand, however, the quantum dots have a much lower quantum efficiency in the matrix, compared with fluorescent dyes. The quantum dots have a quantum efficiency of about 50%, as opposed to the fluorescent dyes which have a quantum efficiency of more than 90%. To date, it has not been possible to produce plates with the requisite high optical efficiencies.

Transparent solar cells, for example Grätzel cells, organic or inorganic thin-film semiconductor cells, are likewise known.

The Grätzel cell is constructed from two glass electrodes with a spacing of typically from 20 μm to 40 μm between them. The two electrodes are coated on the inside with a transparent electrically conductive layer, for example FTO (fluorine-doped tin oxide $SnO_2$), which typically has a thickness of 0.1 μm. According to their function, the two electrodes are also referred to as the working electrode (generation of electrons) and back electrode. A nanoporous layer of titanium oxide $TiO_2$, with a thickness in the range of 10 μm, is applied on the working electrode. A monolayer of a photosensitive dye is in turn adsorbed on its surface. On the back electrode there is a catalytic layer with a thickness of a few μm, which is usually made from platinum. The region between the two electrodes is filled with a redox electrolyte, for example a solution of iodine $I_2$ and potassium iodide.

Another type of transparent solar cell is the organic p-i-n cell. It consists of p- and n-doped conductive layers of organic materials with a large optical band gap, which contribute only insubstantially to the absorption in the visible spectral range. On the other hand, i is an undoped photoactive layer which is kept so thin that it can contribute in its entire thickness to the generation of photocurrent. With such cells, it has been possible to demonstrate internal quantum efficiencies of virtually 100%.

The so-called Tang cell is also counted among transparent solar cells. It is based on the diffusion of excitons to a heterojunction, at which they are separated into free charge carriers. The limiting factor in this case is the exciton diffusion length, which is substantially less than the penetration depth of the light. Out of the total thickness of the Tang cell, which is about 80 nm, only about 10-20 nm, i.e. the immediate vicinity of the heterojunction, contribute to the generation of photocurrent.

Transparent solar cells absorb a certain fraction of the sunlight and convert the photoenergy into current. Efficient transparent solar cells must have a high absorption in the spectral range of the incident light. This high extinction can be achieved in all cell types by increasing the thickness of the photoactive layer. On the other hand, increasing the layer thickness reduces the efficiency because the excitons, electrons and holes generated after the light absorption must travel a longer distance to the electrodes and are subject to recombination losses on the way to the electrode.

SUMMARY OF THE INVENTION

It is an object of the present invention to improve the efficiency of transparent solar cells which absorb sunlight only weakly.

The invention provides a solar cell structure that comprises at least one polymer layer which is doped with a fluorescent dye, or a mixture of a plurality of fluorescent dyes, on or between which there are one or more transparent solar cells. The fluorescent dyes are selected so that they absorb as large a fraction of the sunlight as possible, and emit it into the absorption bands of the photoactive layer of the transparent solar cell. In an advantageous embodiment, a mirror may be applied on the lower side of the bottom layer.

A bandpass filter may be applied on the upper side of the top layer of the solar cell structure provided according to the invention.

The fluorescent light generated in the at least one doped polymer layer shines through the at least one photovoltaic cell arranged there between the plates, and passes through the photovoltaic cell several times. Even without the polymer layer, the solar cells located between the layers advantageously absorb a certain fraction of the incident sunlight and convert it into current. By multiple irradiation through the transparent solar cells which are arranged between, above or below the doped polymer layers, a substantially higher fraction of the sunlight can be absorbed and converted into electrical current. Furthermore, the flat irradiation angle of the fluorescent light through the solar cell increases the absorption probability. The number of irradiations through the functional layer is increased by as small as possible a thickness of the layer structure.

The solar cell structure provided according to the invention comprises one or more solar cells which have only a low absorption, lying between 0-0.5, and only a very small layer thickness 10 nm-300 nm of the photoactive layer, and are distinguished by lower recombination losses.

The side edges of the solar cell structure may advantageously be designed differently. In order for light emitted outside a total reflection angle (order of magnitude about 20%) to be guided in the layer structure, a selectively reflecting bandpass filter layer may optionally be applied onto the solar cell structure provided according to the invention, on the upper side at which the light arrives, i.e. on the illumination side. Below the solar cell structure designed in a layered fashion, transmitted light may be reflected back by a reflector into the solar cell structure. Perylenes or other photostable dyes, which have as high a quantum efficiency as possible, may be used as fluorescent dyes in a preferred embodiment. Quantum dots or phosphorescent inorganic rare-earth compounds are furthermore suitable.

In a particularly preferred embodiment of the solar cell structure provided according to the invention, the doped polymer layers may be fabricated as polymeric fluorescent collector plates made from polymethyl methacrylate (PMMA) or polylauryl methacrylate (PLMA). The concentration of the fluorescent dyes used here is adjusted so that the extinction over the layer thickness of the plates is close to 1 over as wide a spectral range as possible. In a particularly preferred embodiment of the invention, the dye concentrations for the one or more organic or inorganic fluorescent dyes for doping the polymer layer are of the order of between 20 ppm and 100 ppm. The layer thickness of the polymer layer should be as small as possible, and preferably selected in the range of from 0.1 to 1 mm, in order to ensure frequent irradiation through the photoactive layer.

The invention also provides a solar cell structure having at least one transparent photovoltaic cell, in particular a dye solar cell or a thin-film semiconductor cell, that comprises at least one polymer layer which is doped with a fluorescent material and covers at least a transparent photovoltaic cell.

In one embodiment of the solar cell structure the one fluorescent material or the mixture of a plurality of fluorescent materials contains organic fluorescent dyes.

Preferably the one fluorescent material or the mixture of a plurality of fluorescent materials contains inorganic phosphorescent emitters.

In one embodiment the one fluorescent material contains quantum dots.

Preferably the at least one polymer layer is made from a material selected from the following list: polyacrylates, polymethyl methacrylate (PMMA), polylauryl methacrylate (PLMA), polycarbonate or polymers.

Preferably the at least one transparent photovoltaic cell constitutes a dye solar cell according to the Grätzel type.

In another embodiment the at least one transparent photovoltaic cell is designed as a thin-film semiconductor cell.

In a further embodiment the at least one transparently designed photovoltaic cell is an organic solar cell.

Preferably the fluorescent materials are introduced into the at least one polymer plate with a concentration of from 1 ppm to 500 ppm, most preferred with a concentration of between 20 ppm and 200 ppm.

In one embodiment of the solar cell structure a mirror surface is arranged below a polymer layer.

In a further embodiment of the solar cell structure a bandpass filter is arranged on an illumination side of the solar cell structure, on a first side of a first polymer layer provided with a first fluorescent material.

The solar cell structure is preferably designed essentially as a layer structure in which at least one photovoltaic cell is arranged between a first polymer plate doped with fluorescent materials and a further, second polymer plate likewise provided with fluorescent materials.

Preferably the solar cell structure designed as a layer structure has a first mirrored edge and a second mirrored edge as well as likewise mirrored front and rear edges.

In one embodiment perylenes or other photostable dyes, which have a high quantum efficiency, are used as fluorescent materials.

In another embodiment phosphorescent inorganic rare-earth compounds are used as fluorescent materials for doping the polymer plates.

In one embodiment of the solar cell structure the concentration of the fluorescent materials used for doping the at least two polymer layers is adjusted so that the transmission over the layer thickness of the at least two polymer plates is less than 10% over as wide a spectral range as possible.

In another embodiment one or more functional layers of the transparent photovoltaic cell, for example n, p conductors, are doped with fluorescent molecules or nanoparticles

BRIEF DESCRIPTION OF THE DRAWINGS

The invention will be described in more detail below with the aid of the drawing, in which.

EMBODIMENTS

Figure 1:
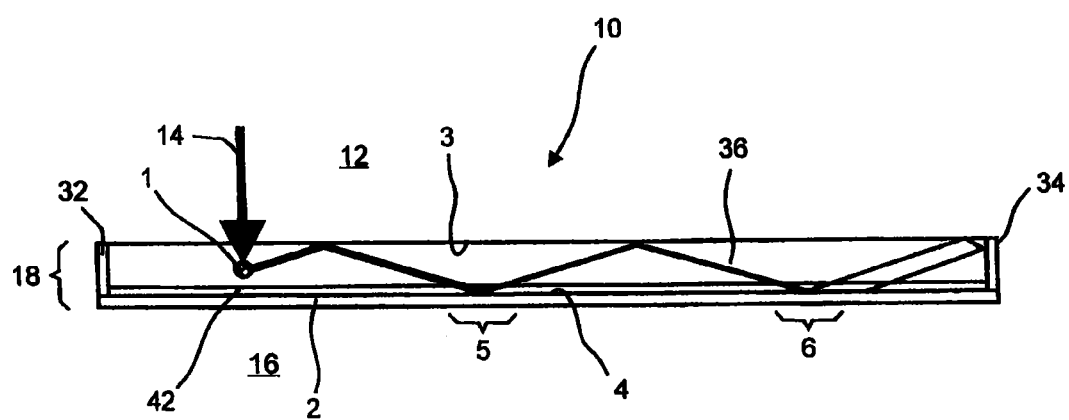
FIG. 1 shows a first embodiment of the solar cell structure provided according to the invention

An alternative embodiment of the solar cell structure provided according to the invention can be found in the representation according to FIG. 1.

FIG. 1 shows a solar cell structure 10, which comprises a polymer layer. Below the polymer plate 36 there is a photovoltaic cell 42, underneath which a mirror surface 2 may in turn be arranged. Reference 14 denotes light incident on an illumination side 12, which strikes fluorescent molecules 1 "dissolved" in a polymer layer 36. The incident light 14 is emitted by them in a stochastic distribution with a wavelength shift into all possible spatial directions. Only the part of this emitted light which is reflected, owing to total reflection at a first reflection surface 3 of the polymer layer 36, onto a second reflection surface 4 i.e. the upper side of the mirror surface 2, is of interest for the subsequent considerations. Besides the polymer layer 36, the solar cell structure 10 represented in FIG. 1—configured as a layer structure 18—also comprises a very thinly designed photovoltaic cell 42, below which the aforementioned mirror surface 2 is located. The solar cell structure is provided with mirrored edges 32 and 34 at its borders. The front and rear side edges (not shown) are also mirrored. This—as indicated in FIG. 1—prevents the fluorescent light from emerging laterally out of the layer structure 18, in particular out of the polymer layer 36. Owing to the reflection, at the first reflection surface 3, of the fraction of the incident light 14 initially emitted by the fluorescent dye molecule 1, a first light transit 5 through the photovoltaic cell 42 takes place after deflection of the beam.

Because of the reflection at the second reflection surface 4, i.e. the mirror surface 2, a further second light transit 6 through the photovoltaic cell 42 takes place, as well as reflection of the light at the inner side of the second edge 34 which is designed to be mirrored. From there, the reflected light again enters the photovoltaic cell 42, i.e. in this case from the upper side.

The fraction of the incident light 14, which is emitted at an angle greater than the limit angle for total reflection, passes through the photovoltaic cell 42 several times. As shown by the representation according to FIG. 1, the solar cell structure 10 according to the invention comprises at least one fluorescent layer in the form of the polymer layer 36. Fluorescent dye molecules are dissolved in it, cf. reference 1 in FIG. 1. As an alternative to uniform distribution of the fluorescent dye molecules 1 inside the polymer layer 36, the latter may also incorporate finally dispersed fluorescent nanoparticles, so-called quantum dots, which fulfill the function of the fluorescent dye molecules.

In its simplest embodiment as represented in FIG. 1, besides the polymer layer 36 and the photovoltaic cell 42, the solar cell structure 10 provided according to the invention also comprises the mirror surface 2 serving as a reflector. In this case, a layer structure 1 comprises said components 2, 36 and 42. As will be further explained below, particularly in conjunction with the representation according to FIG. 2, the solar cell structure 10 may also comprise more layers than the layers represented in FIG. 1.

The effect achievable by mirroring the edges, as indicated by the references 32 and 34 in the representation according to FIG. 1, is that the number of light transits 5, 6, which are merely indicated in FIG. 1, is increased by the light rays of the emitted light 37 being prevented from emerging laterally out of the polymer plate 36, precisely because of the mirrored first and second edges 32 and 34, respectively.

In the representation according to FIG. 1, the layer structure 18 of the solar cell structure 10 comprises the mirror surface 2. In connection with the solar cell structure 10 in the embodiment according to FIG. 1, the fluorescent dye molecules 1 are dissolved in the form of extremely fine particles in the polymer layer 36. The fluorescent dyes, or the quantum dots, may also be introduced into the functional layers (n, p conductor, electrolyte etc.) of the photovoltaic cell 42. The layer 36 may in this case be obviated.

Figure 2:
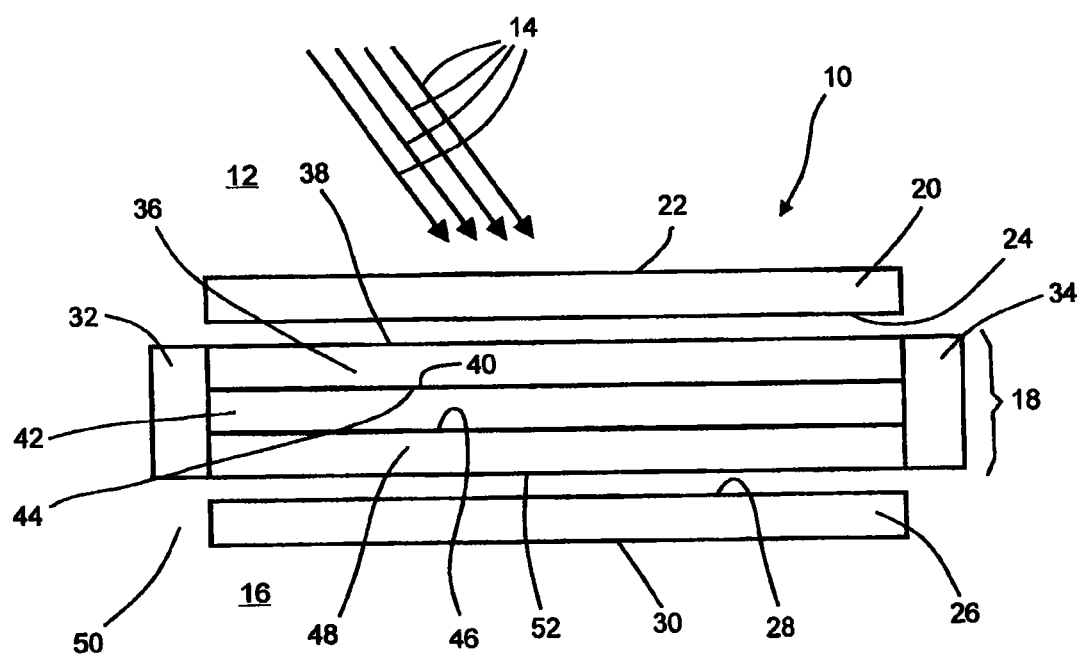
FIG. 2 shows the representation of a layer structure of another embodiment of the solar cell structure provided according to the invention.

Another embodiment of the solar cell structure provided according to the invention, designed in stack form, can be found in the representation according to FIG. 2.

FIG. 2 shows that a solar cell structure 10 provided according to the invention is exposed to light 14 via an illumination side 12. The solar cell structure 10 according to the representation in FIG. 2 is designed essentially as a layer structure 18. While the light 14 enters the solar cell structure 10 on the illumination side 12, this does not happen on the side 16 opposite the illumination side 12. A bandpass filter 20 may optionally be provided on the illumination side 12 of the solar cell structure 10 provided according to the invention, which is represented schematically in FIG. 2. The bandpass filter 20 is used to guide light, emitted outside the total reflection angle, into the solar cell structure 10. While the bandpass filter 20 may be arranged on the illumination side 12 of the solar cell structure 10 according to the representation in FIG. 2, a reflector 26 may be provided on the opposite side 16. The purpose of the reflector 26 is to reflect the transmitted light back into the solar cell structure. The bandpass filter 20 comprises a first side, identified by reference 22, and a further second side 24 which faces a first side 38 of a first polymer layer 36. The first polymer layer 36 is part of the layer structure 18. Between the first polymer layer 36 and at least one further second polymer layer 48, there is a photovoltaic cell 42. The voltaic cell 42 is a transparent solar cell, which may be constituted by any desired transparent solar cell.

From the representation according to FIG. 2, it can be seen that the layer structure 18 comprises a first mirrored edge 32 and a second mirrored edge 34. The front and rear side edges (not shown) are also mirrored. The layer structure 18 according to the representation in FIG. 2 accordingly comprises a first polymer layer 36, on the first side 38 of which the bandpass filter 20 may optionally be applied with its second side 24, and the at least one photovoltaic cell 42 which lies between a second side 40 of the first polymer plate 36 and a first side 54 of the second polymer plate 48. The reflector 26, for reflecting the transmitted light into the solar cell structure 18 again, may optionally be assigned to the second side 52 of the second polymer plate 48.

The solar cell structure 10 provided according to the invention is distinguished in that the first or second polymer plates 36 and 48 are doped with one or more inorganic or organic fluorescent dyes, or other fluorescent materials. In the present context, doping of the first polymer plate 36 or the second polymer plate 38 is intended to mean that fluorescent molecules or nanoparticles (quantum dots) are introduced into the polymer material, from which the first polymer layer 36 or the second polymer layer 38 are made. Polymethyl methacrylate (PMMA) or polylauryl methacrylate (PLMA) is preferably used as a material for producing the first polymer layer 36 or the second polymer layer 38.

For doping the first polymer plate 36 or the second polymer plate 38, the concentration of the fluorescent dyes used or the concentration of a mixture of a plurality of fluorescent materials, containing a fluorescent dye, will be adjusted so that the transmission over the layer thickness of the plates is close to 10% over as wide as possible a spectral range of the sunlight. The dye concentration of the inorganic or organic fluorescent dyes, or the mixture of fluorescent materials being used, will advantageously be adjusted between 20 ppm and 100 ppm.

Inter alia perylenes or other photostable dyes, which have as high a quantum efficiency as possible, may also be used as fluorescent dyes for doping the first polymer layer 36 or the second polymer layer 38. Quantum dots or phosphorescent inorganic rare-earth compounds may furthermore be used for doping the first polymer layer 36 or the second polymer layer 38.

The solar cell structure 10 provided according to the invention absorbs a fraction of the sunlight and converts the photon energy into electrical energy. In contrast to the transparent solar cell, the solar cell structure 10 has a high absorption in the spectral range of the incident light. This is achieved by the fluorescent layers 36 and 48 absorbing light and guiding it by total reflection in the solar cell structure 10. The guided light is in this case partly absorbed and converted into electrical energy at each transit through the photoactive layer of the transparent solar cell 42. Increasing the layer thickness and therefore the absorption of the photoactive layer of the transparent solar cell would lead to longer paths of the excitons, electrons and holes in the transparent solar cell. Owing to the increased recombination probability of the electron-hole pairs generated after the light absorption, however, longer paths reduce the achievable efficiency.

LIST OF REFERENCES 1 fluorescent dye molecule
2 mirror surface, Al, Ag, Au
3 first reflection surface
4 second reflection surface
5 first light transit
6 second light transit
7
8
9
10 solar cell structure
12 illumination side
14 incident light
16 opposite side
18 layer structure
20 bandpass filter
22 first side of bandpass filter
24 second side of bandpass filter
26 diffuse reflector
28 first side of diffuse reflector
30 second side of diffuse reflector
32 first mirrored edge
34 second mirrored edge
36 first polymer plate
38 first side of first polymer plate
40 second side of first polymer plate
42 photovoltaic cell
44 first side
46 second side
48 second polymer plate
50 first side of second polymer plate
52 second side of second polymer plate

The invention claimed is:

1. A solar cell structure comprising:
    at least two polymer layers, wherein the at least two polymer layers are doped with at least one fluorescent material,
    at least one transparent photovoltaic cell layer,
    wherein a first polymer layer is located on top of and covers the at least one transparent photovoltaic cell layer,
    wherein the solar cell structure is a layered structure in which
        the at least one transparent photovoltaic cell layer is arranged below the first polymer layer doped with a fluorescent material,
        one side of the first polymer layer touches a first side of the at least one transparent photovoltaic cell layer,
        the at least one transparent photovoltaic cell layer is arranged above a second polymer layer doped with a fluorescent material,
        one side of the second polymer layer touches a second side of the at least one transparent photovoltaic cell layer,
        so that the at least one transparent photovoltaic cell layer is enclosed between the first and second polymer layers, and
    wherein the layered structure has a first mirrored edge and a second mirrored edge and mirrored front and rear edges.

2. The solar cell structure as claimed in claim 1, wherein the at least one fluorescent material comprises at least one inorganic phosphorescent emitter.

3. The solar cell structure as claimed in claim 1, wherein the at least one fluorescent material comprises at least one quantum dot.

4. The solar cell structure as claimed in claim 1, wherein at least one of the at least two polymer layers is made from a material selected from the group consisting of polyacrylate, polymethyl methacrylate (PMMA), polylauryl methacrylate (PLMA), and other polymers.

5. The solar cell structure as claimed in claim 1, wherein at least one of the at least two polymer layers is made from a polycarbonate.

6. The solar cell structure as claimed in claim 1, wherein the at least one transparent photovoltaic cell layer is a dye solar cell according to the Gratzel type.

7. The solar cell structure as claimed in claim 1, wherein the at least one transparent photovoltaic cell layer is a thin-film semiconductor cell.

8. The solar cell structure as claimed in claim 1, wherein the at least one transparent photovoltaic cell layer is an organic solar cell.

9. The solar cell structure as claimed in claim 1, wherein the at least one fluorescent material is introduced into at least one of the at least two polymer layers at a concentration of from 1 ppm to 500 ppm.

10. The solar cell structure as claimed in claim 1, wherein the at least one fluorescent material is introduced into at least one of the at least two polymer layers at a concentration of between 20 ppm and 200 ppm.

11. The solar cell structure as claimed in claim 1, wherein a bandpass filter is arranged on an illumination side of the solar cell structure, wherein the illuminated side is on another side of the first polymer layer.

12. The solar cell structure as claimed in claim 1, wherein the at least one fluorescent material comprises perylene or another photostable dye, which have a high quantum efficiency.

13. The solar cell structure as claimed in claim 1, wherein the at least one fluorescent material comprises at least one phosphorescent inorganic rare-earth compound.

14. The solar cell structure as claimed in claim 1, wherein a concentration of the at least one fluorescent material is adjusted so that transmission over a layer thickness of one of the at least two polymer layers is less than 10% over a spectral range.

15. The solar cell structure as claimed in claim 1, wherein one or more functional layers of the at least one transparent photovoltaic cell layer is doped with the at least one fluorescent material or at least one type of nanoparticles.

16. The solar cell structure as claimed in claim 1, wherein the at least one fluorescent material comprises perylene, or another photostable dye which has a high quantum efficiency, or a mixture thereof.

17. The solar cell structure as claimed in claim 15, wherein the at least one fluorescent material comprises at least one phosphorescent inorganic rare-earth compound.

18. The solar cell structure as claimed in claim 15, wherein a concentration of the at least one fluorescent material in the at least two polymer layers is adjusted so that transmission over a layer thickness of one of the at least two polymer layers is less than 10% over a spectral range.

19. The solar cell structure of claim 1, wherein a mirror surface is arranged below the second polymer layer.

* * * * *